(12) United States Patent
Chicot et al.

(10) Patent No.: US 9,337,034 B2
(45) Date of Patent: May 10, 2016

(54) METHOD FOR PRODUCING A MOS STACK ON A DIAMOND SUBSTRATE

(71) Applicants: Centre National de la Recherche Scientifique, Paris (FR); Universite Joseph Fourier, Grenoble (FR)

(72) Inventors: Gauthier Chicot, Grenoble (FR); Aurélien Marechal, St Martin D'heres (FR); Pierre Muret, Saint Martin D'uriage (FR); Julien Pernot, Saint Martin D'heres (FR)

(73) Assignees: Centre National de la Recherche Scientifique (FR); Universite Joseph Fourier (FR)

( * ) Notice: Subject to any disclaimer, the term of this patent is extended or adjusted under 35 U.S.C. 154(b) by 0 days.

(21) Appl. No.: 14/367,146

(22) PCT Filed: Dec. 20, 2012

(86) PCT No.: PCT/FR2012/053026
§ 371 (c)(1),
(2) Date: Jun. 19, 2014

(87) PCT Pub. No.: WO2013/093360
PCT Pub. Date: Jun. 27, 2013

(65) Prior Publication Data
US 2015/0014707 A1  Jan. 15, 2015

(30) Foreign Application Priority Data

Dec. 20, 2011  (FR) .................................. 11 62052

(51) Int. Cl.
*H01L 21/04* (2006.01)
*H01L 21/02* (2006.01)
(Continued)

(52) U.S. Cl.
CPC .......... *H01L 21/044* (2013.01); *H01L 21/0231* (2013.01); *H01L 21/02178* (2013.01);
(Continued)

(58) Field of Classification Search
CPC ..................... H01L 21/8206; H01L 29/66015; H01L 21/044; H01L 29/66045; H01L 21/02271; H01L 21/02312; H01L 21/0231; H01L 29/78; H01L 29/517; H01L 29/1602; H01L 21/02178; H01L 29/495; H01L 21/0228
USPC .......................................................... 257/77
See application file for complete search history.

(56) References Cited

U.S. PATENT DOCUMENTS 5,786,604 A * 7/1998 Yamashita et al. ............... 257/77
6,025,211 A * 2/2000 Ishikura et al. ............... 438/105
(Continued)

FOREIGN PATENT DOCUMENTS

EP          827208 A2 *  3/1998

OTHER PUBLICATIONS

Kawakami, et al., "Atomic layer deposition of Al2O3 thin fils on diamond", "Diamond and Related Materials", 1110112005, pp. 2015-2018, vol. 14, No. 11-12, Publisher: Elsevier Science Publishers/ISSN: 0925-9635 (XP027813527), Published in: NL.*

(Continued)

*Primary Examiner* — Ermias Woldegeorgis
(74) *Attorney, Agent, or Firm* — Kaplan Breyer Schwarz & Ottesen, LLP

(57) ABSTRACT

The invention relates to a method for producing a component comprising a conductive grid insulated from a semiconductor monocrystalline diamond substrate by an insulating region, comprising the following steps: a) oxygenating the surface of the substrate so as to replace the hydrogen surface terminations of the substrate with oxygen surface terminations; and b) forming the insulating region on the surface of the substrate by repeated monatomic layer deposition.

9 Claims, 2 Drawing Sheets

(51) Int. Cl.
*H01L 29/51* (2006.01)
*H01L 29/16* (2006.01)
*H01L 29/66* (2006.01)
*H01L 29/78* (2006.01)
*H01L 29/49* (2006.01)

(52) U.S. Cl.
CPC .... *H01L 21/02271* (2013.01); *H01L 21/02312* (2013.01); *H01L 29/1602* (2013.01); *H01L 29/517* (2013.01); *H01L 29/66045* (2013.01); *H01L 29/78* (2013.01); *H01L 21/0228* (2013.01); *H01L 29/495* (2013.01)

(56) References Cited

U.S. PATENT DOCUMENTS 6,124,158 A * 9/2000 Dautartas et al. ............. 438/216
2010/0289031 A1 * 11/2010 Teraji et al. ................... 257/77

OTHER PUBLICATIONS

Yoshikatsu, et al., "Ultrashallow TiC Source/Drain Contacts in Diamond MOSFETs Formed by Hydrogenation-Last Approach", "IEEE Transactions on Eletron Devices", May 11, 2010, pp. 966-972, vol. 57, No. 5, Publisher: IEEE Service Center, Piscataway, NJ; ISSN: 0018-9383 (XPOl1307277), Published in: US.*

"Corresponding International Application No. PCT/FR2012/053026", "International Search Report", Mar. 5, 2013, Publisher: PCT, Published in: FR.

Kueck, D., et al., "Analysis of passivated diamond surface channel FET in dual-gate configuration—Localizing the surface acceptor", "Diamond and Related Materials", Feb. 1, 2010, pp. 166-170, vol. 19, No. 2-3, Publisher: Elsevier Science Publishers, ISSN: 0925-9635 (XP026877176), Published in: NL.

Kawakami, et al., "Atomic layer deposition of Al2o3 thin fils on diamond", "Diamond and Related Materials", Nov. 1, 2005, pp. 2015-2018, vol. 14, No. 11-12, Publisher: Elsevier Science Publishers/ISSN: 0925-9635 (XP027813527), Published in: NL.

Teraji, et al., "Low-leakage p-type diamond Schottky diodes prepared using vacuum ultraviolet light/ozone treatment", "Journal of Applied Physics", Jun. 25, 2009, pp. 126109.1-126109.3, vol. 105, No. 12, Publisher: American Institute of Physics; ISSN: 0021-8979 (XP012125805), Published in: Us.

Yoshikatsu, et al., "Ultrashallow TiC Source/Drain Contacts in Diamond MOSFETs Formed by Hydrogenation-Last Approach", "IEEE Transactions on Eletron Devices", May 1, 2010, pp. 966-972, vol. 57, No. 5, Publisher: IEEE Service Center, Piscataway, NJ; ISSN: 0018-9383 (XP011307277), Published in: US.

"Related International Patent Application: PCT/FR2012/053026", "Written Opinoin of the International Searching Authority", May 3, 2013, Publisher: International Searching Authority, Published in: EP.

* cited by examiner

METHOD FOR PRODUCING A MOS STACK ON A DIAMOND SUBSTRATE

BACKGROUND

The present invention relates to the forming of electronic components inside and on top of single-crystal diamond substrates. It more specifically aims at the forming of a metal-oxide-semiconductor (MOS) stack where the semiconductor material is single-crystal diamond.

DISCUSSION OF THE RELATED ART

It has already been provided to form electronic components, for example, Schottky diodes, by using doped single-crystal diamond as a semiconductor material. Diamond indeed has physical and electronic properties which make it particularly advantageous, particularly for high-power applications.

A major limitation to the use of diamond in semi-conductor components is that known manufacturing methods do not enable to form a metal-oxide-diamond structure capable of operating in inversion mode, that is, where the application of a properly selected potential to the gate causes an inversion of the type of majority charge carriers in the diamond region located under the gate.

As a result, to date, electronic components having their operation using the inversion mode, for example, MOS transistors, cannot be formed on diamond semiconductor substrates.

SUMMARY

Thus, an object of an embodiment of the present invention is to provide a method enabling to manufacture, inside and on top of a single-crystal diamond substrate, a MOS structure capable of operating in inversion mode.

An embodiment of the present invention provides a method of manufacturing a component comprising a conductive gate insulated from a single-crystal diamond semiconductor substrate by an insulating region, comprising the steps of: a) oxygenating the surface of the substrate to replace hydrogen surface terminations of the substrate with oxygen surface terminations; and b) forming the insulating region at the surface of the substrate by atomic layer deposition.

According to an embodiment of the present invention, at step a), the substrate is placed in an enclosure containing dioxygen at a pressure lower than the atmospheric pressure, and is irradiated with ultraviolet light.

According to an embodiment of the present invention, the insulating region is made of aluminum oxide.

According to an embodiment of the present invention, at step b), the forming of each atomic monolayer of aluminum oxide comprises a phase of placing into contact the component surface with an atmosphere comprising trimethyl-aluminum, followed by a phase of placing into contact the component surface with an atmosphere comprising water vapor.

According to an embodiment of the present invention, the gate is made of metal.

According to an embodiment of the present invention, the gate is made of aluminum.

According to an embodiment of the present invention, the substrate comprises an upper epitaxial layer made of P-type doped single-crystal diamond.

Another embodiment of the present invention provides a component comprising a doped single-crystal diamond semiconductor substrate coated with a conductive gate insulated by an insulating region, capable of being obtained by the above-mentioned manufacturing method.

According to an embodiment of the present invention, the application of a potential greater than a first threshold to the gate causes the inversion of a surface region of the substrate located under the gate.

According to an embodiment of the present invention, the application of a potential smaller than a second threshold to the gate causes the accumulation of majority charge carriers in a substrate region located under the gate.

Another embodiment of the present invention provides a method of manufacturing a component comprising a single-crystal diamond semiconductor substrate coated with a conductive gate insulated by an insulating region, wherein a surface region of the substrate located under the gate is invertible.

Another embodiment of the present invention comprises providing a component capable of being obtained by the above-mentioned manufacturing method.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

As usual in the representation of integrated circuits, the various drawings are not to scale.

Figure 1:
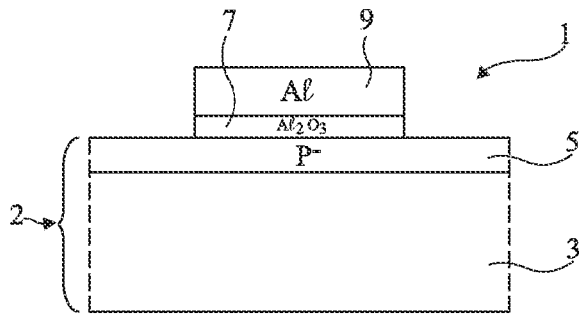
FIG. 1 is a cross-section view schematically showing an example of a MOS structure formed inside and on top of a diamond substrate.

FIG. 1 schematically shows a MOS structure 1 formed inside and on top of a diamond substrate 2. In this example, substrate 2 comprises a support 3 made of single-crystal diamond, having its upper surface coated with a lightly-doped P-type epitaxial diamond layer 5 ($P^-$). A portion of the upper surface of epitaxial layer 5 is coated with an insulating region 7, for example, made of aluminum oxide ($Al_2O_3$). Oxide region 7 is itself coated with a metal electrode 9, or gate, for example, made of aluminum (Al). The stack of gate 9, of insulating region 7, and of semiconductor diamond 5 forms a MOS structure.

Up to now, all attempts made by actors in the field of diamond electronic components to invert the portion of a doped diamond layer of a given conductivity type located under an insulated gate have failed.

Studies conducted by the inventors seem to show that the surface states at the interface between the oxide and the diamond might prevent minority charge carriers from accumulating in the substrate surface region located under the gate until they become a majority. In particular, in the case where the substrate is of type P, the inventors have observed that applying a positive voltage between the gate and the substrate effectively results in attracting electrons towards the gate, but that the electrons are trapped at the interface between the oxide and the diamond, which prevents their accumulation in the surface region of the substrate located under the gate, and thus the inversion of the type of majority charge carriers in this region. If the positive voltage applied between the gate and the substrate is increased, oxide 7 ends up breaking down before a significant accumulation of free electrons (not trapped at the interface) can be obtained in the surface region of the substrate located under the gate oxide.

FIGS. 2A to 2D are cross-section views schematically illustrating steps of an embodiment of a method of manufacturing, inside and on top of a diamond semiconductor substrate, a MOS structure capable of operating in inversion mode. The same elements are designated with the same reference numerals in FIGS. 2A to 2D and in FIG. 1.

Figure 2A:
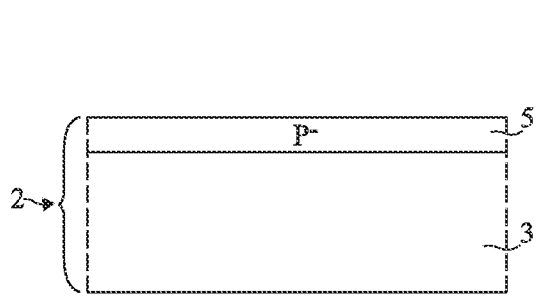
FIGS. 2A to 2D are cross-section views schematically illustrating steps of a method of forming, inside and on top of a diamond substrate, a MOS structure capable of operating in inversion mode.

FIG. 2A illustrates an initial structure comprising a substrate 2 comprising a single-crystal diamond support 3 coated with an epitaxial layer 5 made of P-type doped diamond. Support 3 is for example made of natural cut diamond, or of synthetic diamond obtained by growth at high pressure and high temperature, by chemical vapor deposition, or by any other known technique. The thickness of support 3 is for example in the range from 300 to 700 μm. Epitaxial layer 5 is for example obtained by microwave plasma chemical vapor deposition or MPCVD. The thickness of layer 5 is for example in the range from 0.1 to 50 μm.

Before forming the gate insulator of the MOS structure, a step of oxygenating the upper surface of layer 5 is provided. As an example, the structure is placed in a vacuum enclosure, after which oxygen is introduced into the enclosure, and the upper surface of layer 5 is irradiated by an ultraviolet radiation. This leads to replacing the hydrogen terminations of the upper surface of diamond layer 5 with oxygen terminations. Such an oxygenation method, known per se, is for example described in T. Teraji et al's article, published in *Journal of Applied Physics* 105, 126109 (2009). It should be noted that vacuum enclosure here means an enclosure where the pressure is lower than the atmospheric pressure, for example, in the order of $10^{-5}$ millibars. When oxygen is present in the enclosure, the pressure in the enclosure for example is in the order of 0.4 millibars. As an example, the time of exposure of the structure to oxygen and to ultraviolet radiation is in the range from 1 h to 3 h. The oxygenation step may be carried out at ambient temperature.

More generally, any other oxygenation method capable of replacing hydrogen surface terminations of the diamond with oxygen surface terminations may be used, for example, a plasma oxygenation method.

Figure 2B:
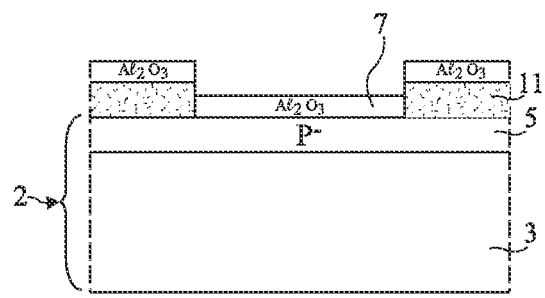

FIG. 2B illustrates a step of forming an aluminum oxide insulating region 7 on the previously-oxygenated upper surface of diamond layer 5. Previously, a mask 11 has been formed, delimiting the substrate regions where aluminum oxide is desired to be deposited. Region 7 is formed by atomic layer deposition, ALD. In an embodiment, the forming of each aluminum oxide atom monolayer comprises a step of placing into contact the surface to be coated with an atmosphere comprising trimethyl-aluminum, followed by a draining step, and then by a step of placing into contact the surface with an atmosphere comprising water vapor, and with a new drainage step. The deposition temperature is for example in the range from 100 to 200° C. In this example, the deposited aluminum oxide thickness is approximately 10 nm.

More generally, insulating region 7 may be made of other materials than aluminum oxide, since these materials may be deposited in by atomic layer deposition (ALD) at the surface of the diamond. If another material than aluminum oxide is used, it will be within the abilities of those skilled in the art to select adapted precursors to perform the deposition.

In practice, the oxide deposition (FIG. 2B) is performed in an enclosure different from the enclosure used to oxygenate the diamond surface (FIG. 2A). Single-crystal diamond has the advantage that its surface terminations, be they hydrogen or oxygen, are very stable once modified, and this, up to temperatures of at least 450° C. In particular, they withstand an exposure to air without being modified. The transfer of the substrate from one enclosure to another during the different method steps thus raises no specific problem.

Figure 2C:
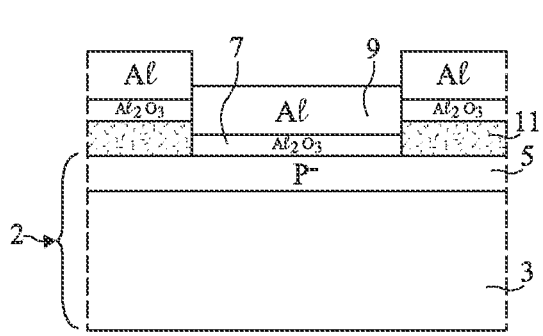

FIG. 2C illustrates a step of forming a gate 9 on the upper surface of aluminum oxide layer 7. Gate 9 is for example made of aluminum, and may be formed by evaporation of aluminum by electron gun and condensation on the surface to be coated, or by any other known method. In the shown example, the same mask 11, previously used to delimit aluminum oxide region 7, is used to delimit gate region 9. In this example, the thickness of gate 9 is approximately 100 nm.

Figure 2D:
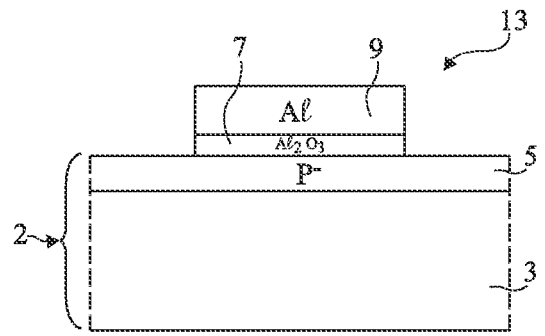

FIG. 2D illustrates a step of removing mask 11, at the end of which a MOS structure 13 comprising the same elements as MOS structure 1 of FIG. 1 is obtained.

As appears in FIG. 3, which will be described in further detail hereafter, an essential feature of MOS structure 13 of FIG. 2D is that it is capable of operating in inversion mode, that is, when a positive potential is applied to gate 9, electrons accumulate in the surface region of layer 5 located under gate 9, until they become a majority over holes in this region. In other words, in MOS structure 13 of FIG. 2D, a surface region of layer 5 located under gate 9 is invertible.

Such an operation is made possible by the quality of the interface between the oxide and the diamond, obtained by combining the use of a step of oxygenating the surface terminations of diamond 5 prior to the forming of oxide region 7, and the use of an atom layer deposition technique (ALD) to form oxide region 7.

Figure 3:
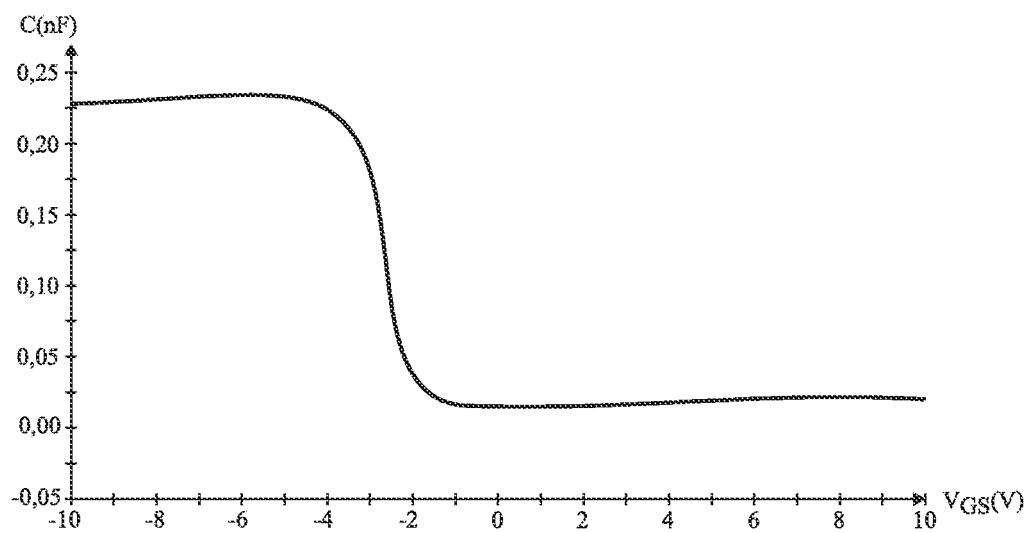
FIG. 3 is a diagram showing the variation of the capacitance of a MOS structure formed according to the method of FIGS. 2A to 2D, according to the applied voltage.

FIG. 3 is a diagram showing the variation of capacitance C in nanofarads (nF) of MOS structure 13 of FIG. 2D, according to voltage $V_{GS}$ in volts (V) applied between gate 9 and semiconductor layer 5. To perform the measurements, a peripheral electrode, not shown, is provided to take an ohmic contact on layer 5.

For a negative voltage $V_{GS}$, for example, in the range from −10 to −4 V, the MOS structure operates in accumulation state, that is, holes (majority charge carriers in P-type layer 5) accumulate in the region of layer 5 located under gate 9. This results in an increase of the electric conductivity of layer 5 in this region. Measurements performed by the inventors show that the capacitance of MOS structure 13 is then directly linked to the thickness of oxide layer 7 according to relation C=ϵ*S/d, where is the dielectric permittivity of aluminum oxide, S is the surface area of gate 9, and d is the thickness of the aluminum oxide region.

When voltage $V_{GS}$ exceeds a first threshold, for example, in the order of −2 V in this example, the measurements performed by the inventors show a clear decrease of the capacitance of MOS structure 13. Such a capacitance decrease indicates that the single-crystal diamond region located under gate 9 is depleted of majority carriers, that is, holes. This is the depletion mode. The depleted layer behaves as an additional insulation thickness (in addition to aluminum oxide thickness 7) between gate 9 and the conductive region of layer 5.

When voltage $V_{GS}$ exceeds a second threshold greater than the first threshold, for example, in the order of 0 V in this example, the capacitance settles, which means that the thickness of the depleted region stops increasing, and that the diamond surface region located under gate 9 inverts.

It should be noted by observing the curve of FIG. 3 that in this example, the depletion (drop in the capacitance of the MOS structure) occurs as soon as a voltage $V_{GS}$ greater than approximately −2 V is applied, that is, even before a positive voltage is applied between the gate and the substrate. This phenomenon can be explained by the work function difference existing between the aluminum of gate 9 and the semiconductor diamond of layer 5.

An advantage of the MOS structure obtained by the method described in relation with FIGS. 2A to 2D is that a minimum conductivity may be obtained in the surface diamond region located under the gate (for example, the channel region of a MOS transistor) for an approximately zero gate voltage. It is thus possible, to obtain the on state, to select either an operation in accumulation (negative voltage on the gate), or an operation in inversion mode (positive voltage on the gate).

Specific embodiments of the present invention have been described. Various alterations, modifications, and improvements will readily occur to those skilled in the art.

A method of manufacturing a MOS stack capable of operating in inversion mode has been described hereabove. It will be within the abilities of those skilled in the art, without showing any inventive step, to use this method, and more particularly the steps of oxygenating the surface terminations of the diamond and of depositing oxide by atomic layer deposition (FIGS. 2A and 2B), to manufacture any MOS component that may have to operate in inversion mode, for example, a MOS transistor. It should however be noted that the provided method enables to form a MOS transistor using the accumulation and depletion modes, as well as a MOS transistor using the inversion and depletion modes.

Further, although the invention has been described in the case where the diamond semiconductor substrate is of type P, it will be within the abilities of those skilled in the art, without showing any inventive step, to adapt the provided method to the forming of a MOS component inside and on top of an N-type doped diamond semiconductor substrate.

The invention claimed is:

1. A method of manufacturing a component comprising a conductive gate insulated from a doped single-crystal diamond semiconductor substrate by an insulating region, comprising the steps of:
   a) oxygenating the surface of the doped single-crystal diamond semiconductor substrate to replace hydrogen surface terminations of the substrate with oxygen surface terminations; and
   b) forming the insulating region at the surface of the oxygen-terminated doped single-crystal diamond semiconductor substrate by atomic layer deposition.

2. The method of claim 1, wherein at step a), the substrate is placed in an enclosure containing dioxygen at a pressure lower than the atmospheric pressure, and is irradiated with ultraviolet light.

3. The method of claim 1, wherein the insulating region is made of aluminum oxide.

4. The method of claim 3, wherein, at step b), the forming of each atom monolayer of aluminum oxide comprises a phase of placing into contact the component surface with an atmosphere comprising trimethyl-aluminum, followed by a phase of placing into contact the component surface with an atmosphere comprising water vapor.

5. The method of claim 1, wherein the gate is made of metal.

6. The method of claim 1, wherein the gate is made of aluminum.

7. The method of claim 1, wherein the substrate comprises an upper epitaxial layer made of P-type doped single-crystal diamond.

8. A component capable of being obtained by the manufacturing method of claim 1.

9. A method of manufacturing a component comprising a conductive gate insulated from a single-crystal diamond semiconductor substrate by an insulating region, comprising the steps of:
   a) oxygenating the surface of the single-crystal diamond semiconductor substrate to replace hydrogen surface terminations of the substrate with oxygen surface terminations; and
   b) forming the insulating region at he surface of the oxygen-terminated single-crystal diamond semiconductor substrate by atomic layer deposition.

* * * * *